(12) United States Patent
Yoshimura et al.

(10) Patent No.: US 6,555,209 B1
(45) Date of Patent: Apr. 29, 2003

(54) METHOD OF MANUFACTURING MULTILAYER WIRING BOARD

(75) Inventors: Eiji Yoshimura, Okaya (JP); Toshiro Higuchi, Yokohama (JP)

(73) Assignee: Daiwa Co., Ltd., Nagano (JP)

( * ) Notice: Subject to any disclaimer, the term of this patent is extended or adjusted under 35 U.S.C. 154(b) by 0 days.

(21) Appl. No.: 09/914,819

(22) PCT Filed: Mar. 1, 2000

(86) PCT No.: PCT/JP00/01186

§ 371 (c)(1),
(2), (4) Date: Aug. 31, 2001

(87) PCT Pub. No.: WO00/52977

PCT Pub. Date: Sep. 8, 2000

(30) Foreign Application Priority Data

Mar. 3, 1999 (JP) .......................... 11-055731
Apr. 22, 1999 (JP) .......................... 11-114538

(51) Int. Cl.$^7$ .................................. B32B 3/00
(52) U.S. Cl. ...................... 428/209; 174/261; 174/265; 205/183; 205/184; 430/16
(58) Field of Search .................. 428/209; 174/264, 174/261, 265; 205/167, 169, 183, 184; 430/16

(56) References Cited

U.S. PATENT DOCUMENTS 5,200,026 A    4/1993    Okabe 6,010,769 A  *  1/2000    Sasaoka et al. ............. 174/262

FOREIGN PATENT DOCUMENTS

| JP | 58-213451 | 12/1983 |
| JP | 04-023390 | 1/1992 |
| JP | 5-291744 | 11/1993 |
| JP | 6-216527 | 8/1994 |
| JP | 6-310857 | 11/1994 |
| JP | 6-314878 | 11/1994 |
| JP | 9-23065 | 1/1997 |
| JP | 10-135639 | 5/1998 |

\* cited by examiner

*Primary Examiner*—Cathy Lam
(74) *Attorney, Agent, or Firm*—Knobbe, Martens, Olson & Bear, LLP

(57) ABSTRACT

A method of manufacturing a multilayer wiring board comprising a step of forming an upper wiring layer (27), a part thereof being electrically connected to a pillar-shaped metallic body (24a), after he pillar-shaped metal body (24a) is formed on a lower wiring layer (22) is characterized in that the step of forming the metallic body includes a sub-step of forming a plating layer (24) constituting the metallic body, a sub-step of forming a mask layer (25) on the surface where the metal body is formed, of the plating layer, and a sub-step of etching the plating layer. The manufacture can be carried out with simple equipment combination of conventional steps and the wiring layer can be made fine. Moreover, a multilayer wiring board having a high reliability can be manufactured,

16 Claims, 14 Drawing Sheets

METHOD OF MANUFACTURING MULTILAYER WIRING BOARD

BACKGROUND OF THE INVENTION

1. Field of the Invention

The present invention relates to a multilayer wiring board having two or more wiring layers and a manufacturing method thereof. More specifically, this invention relates to the multilayer wiring board and the manufacturing method thereof having the step of forming an upper wiring layer, a part thereof being electrically connected with a pillar-like metallic body, after the pillar-like metallic body is formed on a lower wiring layer.

2. Description of the Related Art

In recent years, as electronic equipments and the like are miniaturized and light-weighted, electronic parts are miniaturized and wiring boards onto which the electronic parts are mounted are required to be higher density, In order to heighten the density of the wiring boards, a method of heightening line density of wiring layers or a method of obtaining a multilayer structure by laminating a plurality of wiring layers are adopted.

The method of manufacturing a multilayer wiring board includes a joining method of forming wiring layers respectively on a plurality of substrates and joining the substrates in a state that insulating sheets intervene between the substrates, and a build-up method of forming insulating layers on a substrate on which a wiring pattern is formed and forming the wiring pattern on the insulating layer, namely, of forming a laminated structure by repeating formation of the insulating layers and wiring patterns. However, since the latter build-up method is advantageous to the heightening of the density of the wiring boards, this method is becoming the mainstream.

Meanwhile, in the multilayer wiring board, conductive connection between the wiring layers should be carried out according to a circuit design. Such conductive connection have adopted an conductive connecting structure that au opening portion of an insulating layer which is called as a via hole is plated cylindrically. However, as for the via hole, when the opening portion is formed and plated, there arises problems that fine processing is difficult and air becomes contaminant. For this reason, in the case where reliability of the wiring board is maintained, the size of the via hole is limited. Moreover, when multilayer are laminated, it is difficult to form a via hole just above a via hole, and the design of the laminated structure is restricted. For this reason, the heightening of the density of the multilayer wiring boards is limited.

On the contrary, in the method of the wiring layers are electrically connected by a pillar-like solid conductor, there does not arise such a problem. For this reason, this method can further heighten the density of the multilayer wiring boards in comparison with the case where a via hole is formed Therefore, it is estimated in this field that the conductive connection between the wiring layers by means of the pillar-like conductor will become the mainstream in the future, and a lot of methods of forming pillar-like conductors are suggested.

For example, Japanese Patent Application Laid-Open No. 9-23065 discloses a method of forming an opening portion on an insulating layer provided on a lower wiring layer by means of laser processing or the like and carrying out electroless plating on the opening portion and filling a pillar-like conductor into the opening portion. Moreover, Japanese Patent Application Laid-Open No. 6-314878 discloses a method of wholly conducting a lower wiring layer and forming a resist pattern having an opening portion and depositing metal on a concave section of the resist pattern by means of electrolytic plating to form the pillar-like conductor.

However, both the above methods have a problem that a height of the pillar-like conductor is easily non-uniform. The former method has a problem that it takes a long time to form the pillar-like conductor because the electroless plating is carried out. The latter method has a problem that current density cannot be heightened and similarly the formation of the pillar-like conductor takes a long time because the electrolytic plating is carried out. Further, the formation of a resist pattern requires a large-scale apparatus for emitting a laser, and thus these methods are disadvantageous from the viewpoint of costs. Further, since it is difficult to securely remove a resist on a bottom portion of the opening portion, reliability of conducting of the pillar-like conductor is lowered.

Therefore, it is an object of the present invention to provide a multilayer wiring board and a manufacturing method thereof which are capable of manufacturing a multilayer wiring board with a combination of simple facility and conventional process and thinning lines of the wiring layer and which have high reliability of the wiring board.

SUMMARY OF THE INVENTION

The above object can be achieved by the following invention. Namely, a multilayer wiring board manufacturing method of the present invention having the step of forming a pillar-like metallic body on a lower wiring layer, and then forming an upper wiring layer, a part thereof being electrically connected with the pillar-like metallic body, is characterized in that the pillar-like metallic body forming step includes: the step of forming a plating layer of metal constituting the pillar-like metallic body; the step of forming a mask layer on a surface portion of the plating layer where the pillar-like metallic body is formed; and the step of etching the plating layer.

According to the manufacturing method of the present invention, since the plating layer is formed not in the opening but on the whole surface and the pillar-like metallic body is formed by etching, laser emission or the like is not particularly required, and a diameter of the pillar-like metallic body can be reduced. Further, since the opening section from which the resist is removed is not plated, the reliability of conductivity between the lower wiring layer and the pillar-like metallic body is heightened. As a result, manufacturing can be carried out by simple facility and combination of conventional steps, and the multilayer wiring board, wherein the wiring layer can be thinned and the reliability of the wiring board is high, can be manufactured.

The manufacturing method of the present invention includes the following first through fourth embodiments.

In the first embodiment, the pillar-like metallic body forming step includes the steps of:
(1a) coating an approximately whole surface of said lower wiring layer including a non-patterned portion with another metal showing resistance at the time of etching the metal constituting said pillar-like metallic body to form a protective metallic layer,
(1b) forming a plating layer of the metal constituting said pillar-like metallic body on an approximately whole surface of said protective metallic layer by means of electrolytic plating;

(1c) forming a mask layer on a surface portion of said plating layer where said pillar-like metallic body is formed;

(1d) etching said plating layer; and (1e) etching under condition wherein at least said protective metallic layer can be corroded to remove at least said protective metallic layer covering the non-patterned portion According to the manufacturing method of the first embodiment, since the protective metallic layer is provided, the lower wiring layer is not corroded at the time of etching the plating layer, and the desired pillar-like metallic body can be formed in the position where the mask layer is formed. Further, after the step (1d), the protective metallic layer remaining on the non-patterned portion can be removed securely by the step (1e), and the protective metallic layer under the pillar-like metallic body is hardly corroded at the step (1e). For this reason, short circuit between pattern portions hardly occurs, the reliability of the wiring board is heightened, and thinning is possible. Further, since the protective metallic layer is formed on the whole surface, the plating layer can be formed by electrolytic plating. Moreover, since the plating layer is formed in the hole but on the whole surface, the plating layer having a desired thickness can be formed for a short time with high current density.

In the above manufacturing method, it is preferable that the step (1a) executes electroless plating on the whole surface of the previously patterned lower wiring layer including the non-patterned portion so as to form a base conductive layer and further executes electrolytic plating on the approximately whole surface so as to form the protective metallic layer, and the step (1e) executes the etching under condition wherein said protective metallic layer can be corroded and then removes said base conductive layer remaining on the non-patterned portion by means of soft etching.

In this case, since the electroless plating is previously carried out on the whole surface so that the base conductive layer is formed, this can be a plating-use electrode, and the protective metallic layer can be formed suitably by electrolytic plating. Such electrolytic plating is preferable because electroless plating occasionally makes it difficult to etch the protective metallic layer due to mixing of component other than metal. Moreover, since the base conductive layer remaining on the non-patterned portion is removed by soft etching, short circuit between pattern portions is prevented, so that the reliability of the wiring board can be further improved.

In addition, it is preferable that the step (1a) executes electroless plating on an approximately whole surface of an insulating layer so as to form a base conductive layer and then executes electrolytic plating on an approximately whole surface of the patterned lower wiring layer on the base conductive layer so as to form the protective metallic layer, and the step (1e) executes etching under the condition wherein the protective metallic layer can be corroded and then removes the base conductive layer remaining on the non-paned portion by means of soft etching.

In this case, similarly to the above, the protective metallic layer can be formed suitably. Moreover, the reliability of the wiring board can be further improved.

In addition, it is preferable that prior to the step (1a), an insulting layer having the approximately same thickness as a patterned portion of the lower wiring layer is formed on the non-patterned portion of the lower wiring layer so that the surface is flattened, In this case, since the protective metallic layer formed at the step (1a) is flattened, the protective metallic layer can be removed securely at the step (1e), and short circuit between patterns or the like can be prevented securely.

In the above method, it is preferable that the metal constituting the pillar-like metallic body is copper and another metal constituting the protective metallic layer is gold, silver, zinc, palladium, ruthenium, nickel, rhodium, lead-tin solder alloy or nickel-gold alloy. In this case, the pillar-like metallic body can be cheaply formed by copper having good conductivity by the general-purpose etching method. Moreover, since the metal constituting the protective metallic layer shows good resistance for etching, the reliability of the wiring board can be maintained high.

A multilayer wiring board of the present invention is obtained by the manufacturing method of the first embodiment and has a structure that a lower wiring layer and an upper wiring layer are electrically connected, the structure comprising the lower wiring layer, a protective metallic layer provided on a part of an upper surface of the wiring layer, a pillar-like metallic body provided on a whole upper surface of the protective metallic layer and the upper wiring layer, a part 1 thereof being electrically connected with the pillar-like metallic body. The multilayer wiring board of the present invention can be manufactured by simple facility and combination of the conventional steps, and the wiring layer can be thinned, and the reliability of the wiring board becomes high.

In the manufacturing method of a second embodiment, the pillar-like metallic body forming step includes:

(2a) forming a conductive layer on a surface of a metallic panel layer provided on an approximately whole surface of an insulating layer, the conductive layer having resistance at the time of etching the metallic panel layer and the same pattern as said lower wiring layer;

(2b) forming a plating layer of metal which can be etched simultaneously as said metallic panel layer on an approximately whole surface of said metallic panel layer with said conductive layer;

(2c) forming a mask layer on a sure portion of said plating layer where said pillar-like metallic body is formed; and (2d) etching said metallic panel layer and said plating layer so as to form said lower wiring layer and said pillar-like metallic body.

According to the manufacturing method of the second embodiment, after the conductive layer to be etching resist is formed on the surface of the metallic panel layer, the plating layer and the mask layer for forming the pillar-like metallic body are formed and etching is carried out. For this reason, when the metallic panel layer and the plating layer are corroded, the pillar-like metallic body and the patterned wiring layer and conductive layer remain. Therefore, since the pillar-like metallic body can be formed and simultaneously the wiring layer can be formed, a number of steps and time required for all the steps can be reduced and simultaneously load in the steps can be reduced. Moreover, since the conductive layer which intervenes between the pillar-like metallic body and the lower wiring layer is conductive, the pillar-like metallic body and the wiring layer can be electrically connected.

In the above manufacturing method, it is preferable that the step (2a) coats the metallic panel layer with a photosensitive resin layer and pattern-exposes and develops so as to remove a portion where the conductive layer is formed, and plates the removed portion with metal so as to form the conductive layer.

In this case, the conductive layer of the present invention can be formed by the same method as the case of forming a conventional wiring layer in simple general-purpose facility. At this time, since the metallic panel layer to be a base is conductive, electrolytic plating can be carried out so that adhesion with the wiring layer to be formed can be heightened.

In addition, it is preferable that the metal constituting the metallic panel layer and the plating layer is copper, and the metal constituting the conductive layer is gold, silver, zinc, palladium, ruthenium, nickel, rhodium, lead-tin solder alloy or nickel-gold alloy, In this case, the lower wiring layer and the pillar-like metallic body can be formed by copper having good conductivity at low cost by the general-purpose etching method, and the metal constituting the conductive layer shows good resistance for the etching. For this reason, the reliability of the wiring layer can be maintained high.

A multilayer wiring board of the present invention is manufactured by the manufacturing method according to the second embodiment. Similarly to the first embodiment, the multilayer wiring board can be manufactured by simple facility and combination of conventional steps, the wiring layer can be thinned, and the reliability of the wiring board becomes high.

In the manufacturing method of a third embodiment, the pillar-like metallic body forming step includes the steps of:

(3a) forming a protective layer, in which a portion where said pillar-like metallic body is formed is made of a conductor and the other portion is made of an insulator, so that said protective layer covers an approximately whole surface of said lower wiring layer, (3b) forming a plating layer of metal constituting said pillar-like metallic body on an approximately whole surface of said protective layer;

(3c) forming a mask layer on a surface portion of said plating layer where said pillar-like metallic body is formed; and (3d) etching said plating layer.

According to the manufacturing method of the third embodiment, since the above protective layer is provided, the lower wiring layer is not corroded at the time of etching the plating layer, and the pillar-like metallic body having a desired shape can be formed in a desired position. At this time, since the conductive portion is formed on the protective layer, the lower wiring layer and the pillar-like metallic body can be conductive. Moreover, since the patterned portion of the wiring layer is coated mainly with an insulator, a possibility of short circuit between patterns is small, and the reliability becomes high and thinning is possible. Moreover, since metal for protecting the patterns is not much required, this is advantageous to the cost.

In the above manufacturing method, it is preferable that the step (3a) coats the lower wiring layer with a photosensitive resin layer, and pattern-exposes and develops so as to open the portion where the conductor is formed, and plates the opened portion with metal so as to form the protective layer. In this case, the protective layer having high reliability can be formed by comparatively simple step and a low-priced apparatus.

In addition, it is preferable that when the opened portion is plated with metal, electroless plating is carried out by using the metal constituting the lower wiring layer as a catalyst. In this case, the conductor having a desired thickness can be formed selectively on the opened section.

A multilayer wiring board of the present invention is manufactured by the manufacturing method according to the third embodiment. Similarly to the other embodiments, the multilayer wiring board can be manufactured by simple facility and combination of conventional steps, the wiring layer can be thinned, and the reliability of the wiring board is high.

Another method of manufacturing a multilayer wiring board includes the step of forming a pillar-like metallic body on a topmost wiring layer by means of the above step of forming a pillar-like metallic body. Such a pillar-like metallic body is formed for mounting or the like of chip parts, but similarly to the case of the pillar-like metallic body between the wiring layers, the pillar-like metallic body having high density and reliability can be formed by simple facility and combination of conventional steps, In addition, in another multilayer wiring board of the present invention, a pillar-like metallic body is formed on a topmost wiring layer by means of the above step of forming a pillar-like metallic body.

BRIEF DESCRIPTION OF THE DRAWINGS

FIGS. 4a through 4g are step diagrams showing the second embodiment;

In the respective diagrams, 11 is a protective metallic layer, 20 is a photosensitive resin layer, 21 is a substrate, 22 is a lower wiring layer, 23 is a conductive layer, 24 is a plating layer, 24a is a pillar-like metallic body, 25 is a mask layer, 27 is a upper wiring layer, and 40 is a pillar-like metallic body formed on a topmost wiring layer.

DETAILED DESCRIPTION OF THE PREFERRED EMBODIMENT

There will be detailed below the embodiments of the present invention with reference to the diagrams.

First Embodiment

The present embodiment refers to an example that when a wiring layer is laminated on both surfaces of a substrate, a pillar-like metallic body is formed on both sides of the substrate.

Figure 1A:
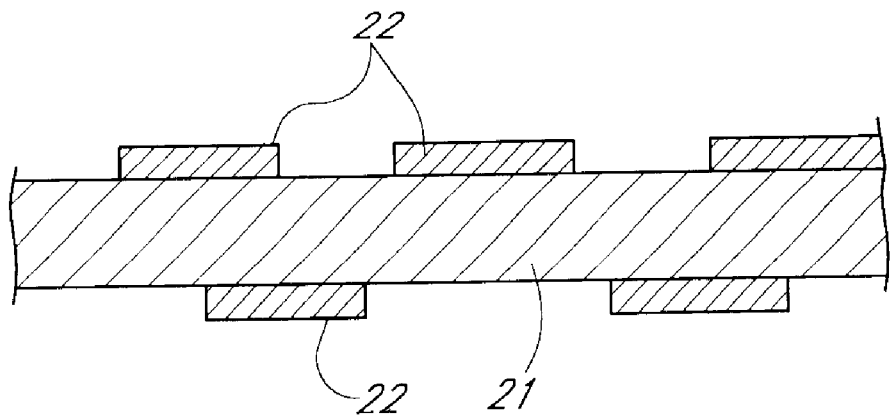
FIGS. 1a through 1c are step diagrams showing a method of manufacturing a multilayer wiring board according to a first embodiment of the present invention.

As shown in FIG. 1a, a substrate 21 where a wiring layer 22 is patterned on its both surfaces is prepared. At this time, any pattern forming method may be used, so a method using etching resist, or a method using pattern plating resist can be used. As the substrate 21, a substrate which is made of glass fiber and various reactive curing resin such as polyimide resin or the like can be used. Moreover, as metal constituting the wiring layer 22, normally copper, nickel, tin or the like is used.

Figure 1B:
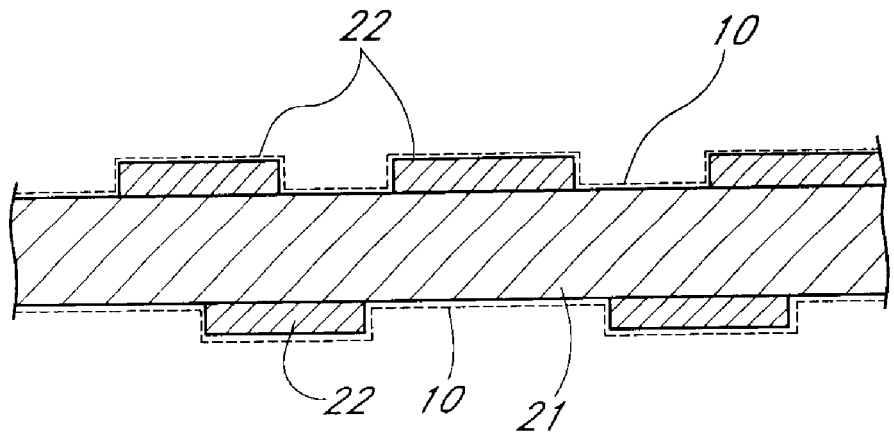

Next, as shown in FIG. 1b, a whole surface of the previously patterned wiring layer 22 including non-patterned portion is electroless-plated so that a base conductive layer 10 is formed. At the time of electroless plating, normally a plating solution of copper, nickel, tin or the like is used, but these metallic materials may be the same as or different from the metal constituting the wiring layer 22. Plating solutions for the electroless plating according to various metals are well known, and various solutions are on the market. In general, the solution containing metallic ion source, alkaline source, reducing agent, chelator, stabilizer or the like can be used. Here, prior to the electroless plating, a plating catalyst such as palladium maybe deposited.

Figure 1C:
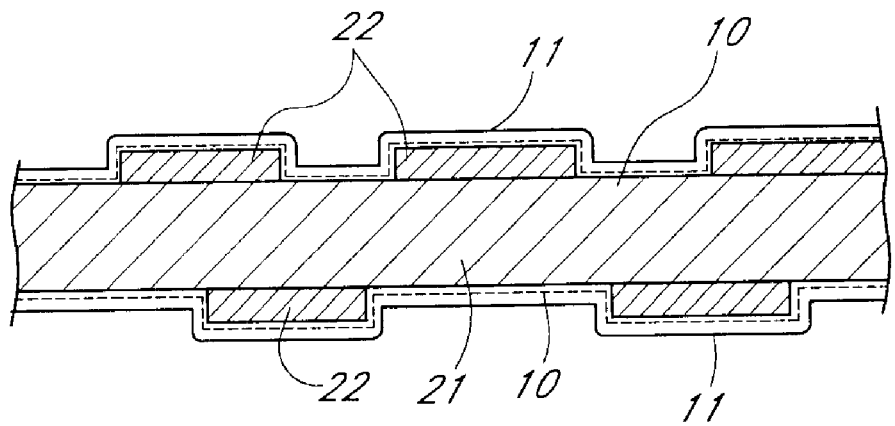

Next, as shown in FIG. 1c, a whole surface of base conductive layer 10 is electrolytically plated so that a protective metallic layer 11 is formed on it. As a result, the whole surface of the lower wiring layer 22 including the non-patterned portion is coated with the protective metallic layer 11. At this time, as metal constituting the protective metallic layer 11, another metal showing resistance at the time of etching a metal constituting a pillar-like metallic body is used. More concretely, in the case where the metal constituting the pillar-like metallic body is copper, as another metal constituting the protective metallic layer, gold, silver, zinc, palladium, ruthenium, nickel, rhodium, lead-tin solder alloy, nickel-gold alloy or the like is used. However, the present invention is not limited to these combinations of metal, and any combination of metal capable of being electrolytically plated and another metal showing resistance at the time of etching the metal capable of being electrolytically plated can be used.

The electrolytic plating can be carried out by a well-known method, but in general, a substrate in FIG. 1b is soaked in a plating bath and simultaneously metal is deposited on a cathode side by electrolysis reaction in a state that the base conductive layer 10 is a cathode and the metallic ion supply source of the metal to be plated is an anode.

Namely, at step (1a) of the present invention, another metal showing resistance at the time of etching the metal constituting the pillar-like metallic body is coated onto the whole surface of the lower wiring layer 22 including the non-patterned portion, so that the protective metallic layer 11 is formed. However, as mentioned above, the protective metallic layer 11 may be coated in a state in which the base conductive layer 10 or the like intervenes. Moreover, the protective metallic layer 11 may be directly coated without allowing the base conductive layer 10 or the like to intervene.

Figure 1D:
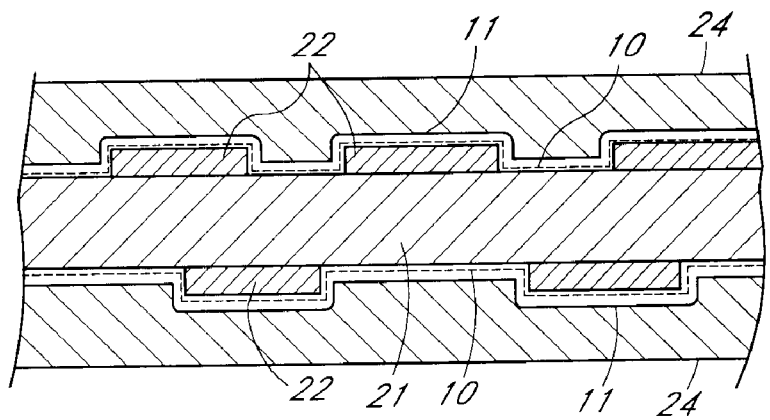
FIGS. 1d through 1f are step diagrams showing the first embodiment.

At step (1b) of the present invention, as shown in FIG. 1d, a metallic plating layer 24 constituting the pillar-like metallic body 24a is foamed on a whole surface of the protective metallic layer 11 by electrolytic plating. As the metal, normally copper, nickel or the like is used, but this metal may be the same as or different from the metal constituting the wiring layer 22. The electrolytic plating is carried out by the similar method to the above one, but the protective metallic layer 11 is used as a cathode. A concrete thickness of the plating layer 24 is, for example, 20 to 200 $\mu$m or more. Since at step (1b) the plating layer 24 is formed on the whole surface by electrolytic plating, the height of the plating layer 24 becomes approximately uniform so that the pillar-like metallic body 24a with approximately uniform height can be formed quickly.

Figure 1E:
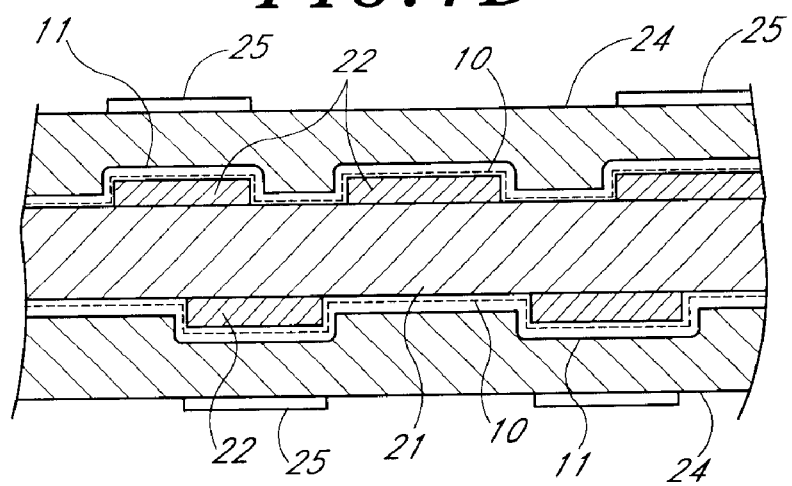

At step (1c) of the present invention, as shown in FIG. 1e, a mask layer 25 is formed on a surface of the plating layer 24 where the pillar-like metallic body 24a is formed. The present embodiment shows an example that the mask layer 25 is printed into scatter point state by screen printing. Sizes of the respective mask layers 25 (area or outer diameter) are determined according to sizes of the pillar-like metallic bodies 24a, and the mask layers 25 having outer diameter of; for example, 100 to 300 $\mu$m or more are exemplified. Since the mask layer 24 is formed into scatter dot state at step (1c), the mask layer 25 can be formed by an easy and low-priced method such as printing.

Figure 1F:
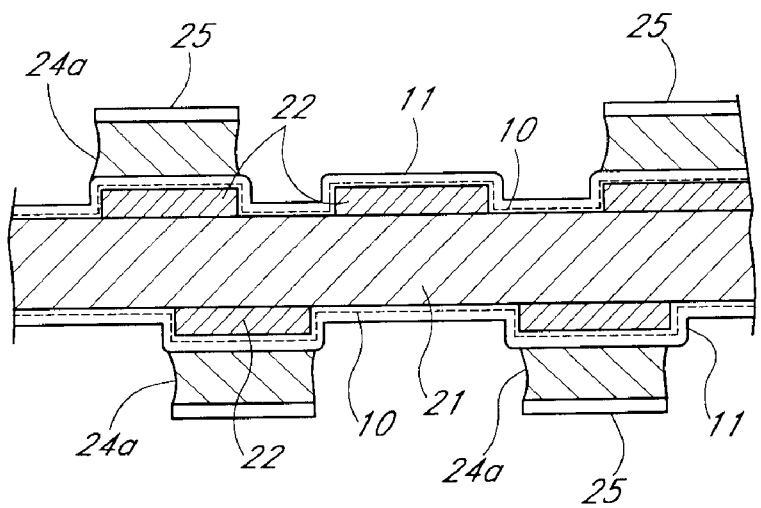

At step (1d) of the present invention, as shown in FIG. 1f, the plating layer 24 is etched. At this time, when an erosion amount by means of the etching is too large, the pillar-like metallic body 24a to be formed has a small diameter (undercut increases), and thus the steps hereinafter is occasionally obstructed. On the contrary, when an erosion amount is too small, the plating layer 24 remains on the non-pattered portion thereby to occasionally cause short-circuit. Therefore, it is desirable that a degree of the erosion by means of the etching is as shown in FIG. 1f or falls within a range that the degree shown in FIG. 1f slightly decreases or increases.

As an etching method, there are etching methods using various etching solution according to types of metal constituting the plating layer 24 and the protective metallic layer 11. For example, in the case where the plating layer 24 (namely, the pillar-like metallic body 24a) is copper and the protective metallic layer 11 is the aforementioned metal (including metallic resist), an alkaline etching solution, ammonium persulfate, hydrogen peroxide/sulfuric acid or the like is used. According to the above etching, as shown in FIG. 1f, the wiring layer 22 (patterned portion and non-patterned portion) coated with the protective metallic layer 11, the pillar-like metallic body 24a and the mask layer 25 are not etched so as to remain.

Figure 1G:
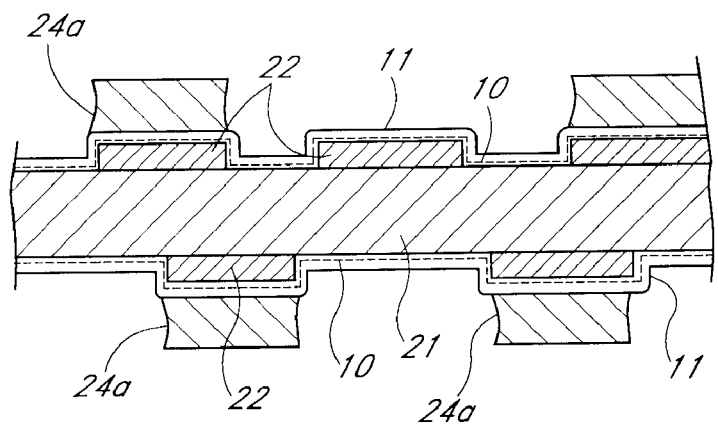
FIGS. 1g through 1i are step diagrams showing the first embodiment.

Next, as shown in FIG. 1g, the mask layer 25 is removed, but at this time agent removal, peeling removal or the like may be selected suitably according to types of the mask layer 25. For example, in the case where the mask layer 25 is formed by using photosensitive ink according to screen printing, an alkaline agent or the like is used.

Figure 1H:
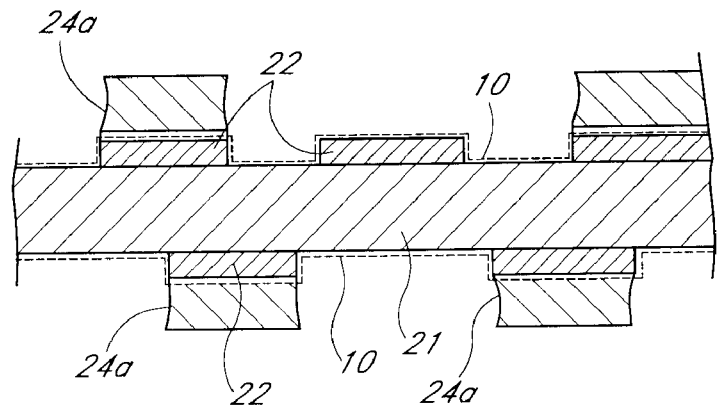

Next, as shown in FIG. 1h, the etching is carried out so that the protective metallic layer 11 can be corroded. As the etching method, there is an etching method using an etching solution which is different from the step (1d), but it is preferable that since a chloride etching solution corrodes both metallic resist and copper, another etching solution is preferably used. More concretely, in the case where the pillar-like metallic body 24a and the lower wiring layer 22 are copper and the protective metallic layer 11 is the aforementioned metal, it is preferable that an acid etching solution or the like such as nitric acid, sulfuric acid or cyanogen type on the market is used. As a result, as shown in FIG. 1h, only the protective metallic layer 11 which intervenes between the pillar-like metallic body 24a and the wiring layer 22 (patterned portion) can be allowed to remain. Moreover, only the base conductive layer 10 remains on the non-patterned portion.

Figure 1I:
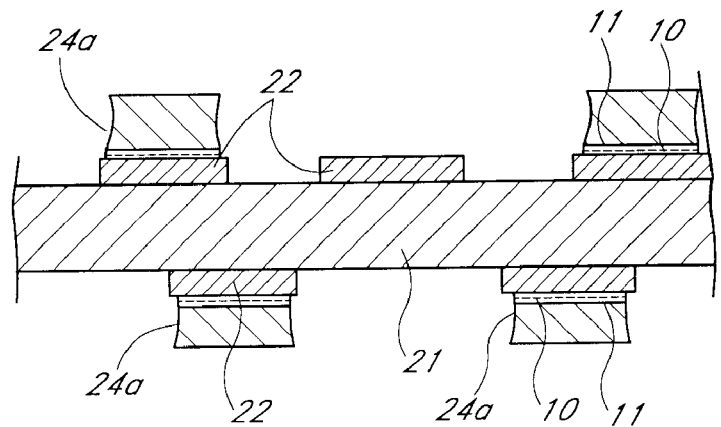

As shown in FIG. 1i, the base conductive layer 10 remaining on the non-patterned portion is removed by soft etching, but the soft etching is for preventing the pillar-like metallic body 24a and the exposed wiring layer 22 (patterned portion) from being too corroded. As the soft etching method, an etching solution for the metal constituting the base conductive layer 10 is used with low density or under mild etching conditions.

Namely, at step (1e) of the present invention, the etching is carried out so that at least the protective metallic layer 11 is corroded, so that the protective metallic layer 11 which is coated at least on the non-patterned portion is removed. However, in the case where the base conductive layer 10 is provided as mentioned above, the protective metallic layer 11 and the base conductive layer 10 are etched successively so as to be removed from the non-patterned portion. As a result, short circuit between the pattern portions can be prevented securely.

Figure 1J:
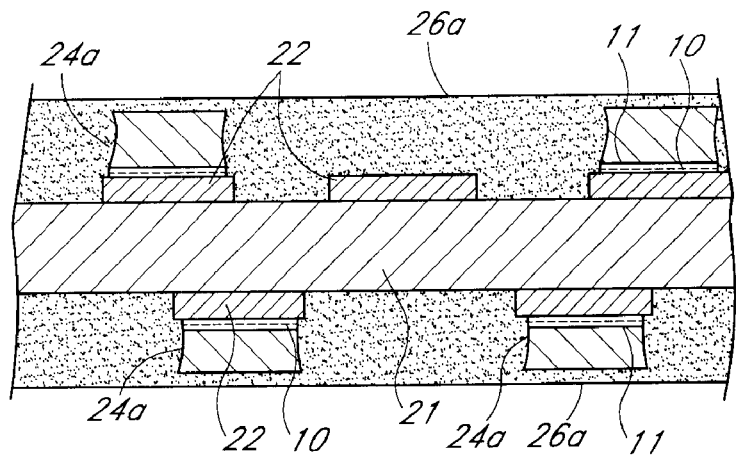
FIGS. 1j through 1l are step diagrams showing the first embodiment.

As shown in FIG. 1j, an insulating material 26a is applied in order to form an insulating layer 26. As the insulating material 26a, for example, reactive curing resin such as low-priced liquid polyimide resin with good insulation can be used. After this resin is applied by various methods so as to be slightly thicker than the height of the pillar-like metallic body 24a, it may be cured by heating or light emission. As the coating method, a hot press and various coaters are used.

Figure 1K:
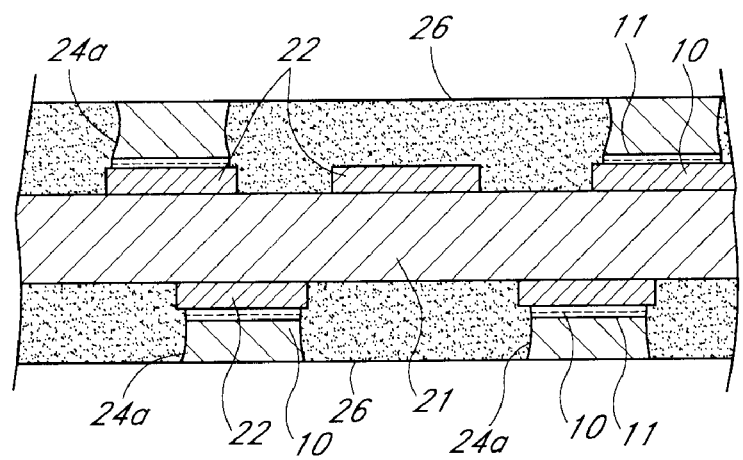

As shown in FIG. 1k, the cured insulating material 26a is ground or abraded so that the insulating layer 26 having the approximately same thickness as the height of the pillar-like metallic body 24a is formed. As the grinding method, there is a method using a grinding machine having a plurality of diamond or the like-made hard rotary blades arranged in a radial direction of a rotary board. While the above hard rotation blades are being rotated, they are moved along an upper surface of the fixed wiring board so that the upper surface can be flattened. Moreover, as the abrading method, there is a method of lightly abrading using a belt sander, buffing or the like.

Figure 1L:
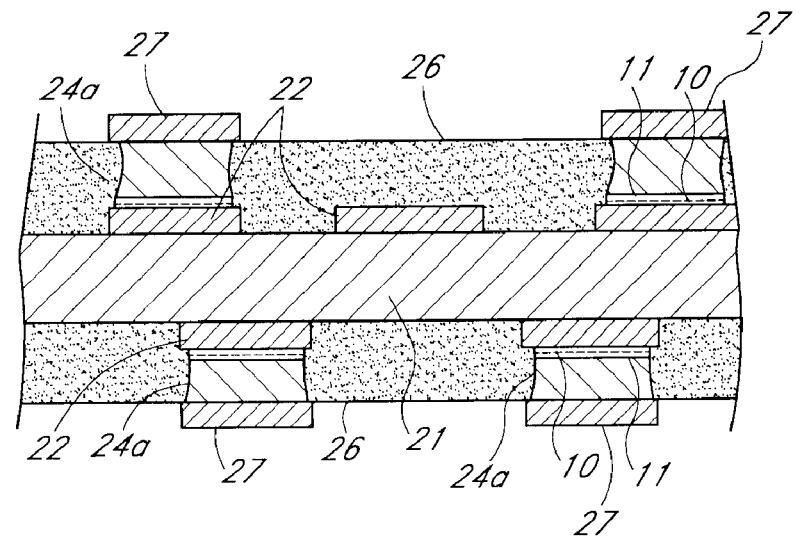

As shown in FIG. 1l, an upper wiring layer 27, a part thereof being electrically connected with the pillar-like metallic body 24a is formed. The wiring layer 27 can be formed in the manner similar to the manner of the lower swing layer 22. For example, a predetermined mask is formed by using photolithography technique and is etched so that the wiring layer 27 having a predetermined pattern can be formed.

Figure 3:
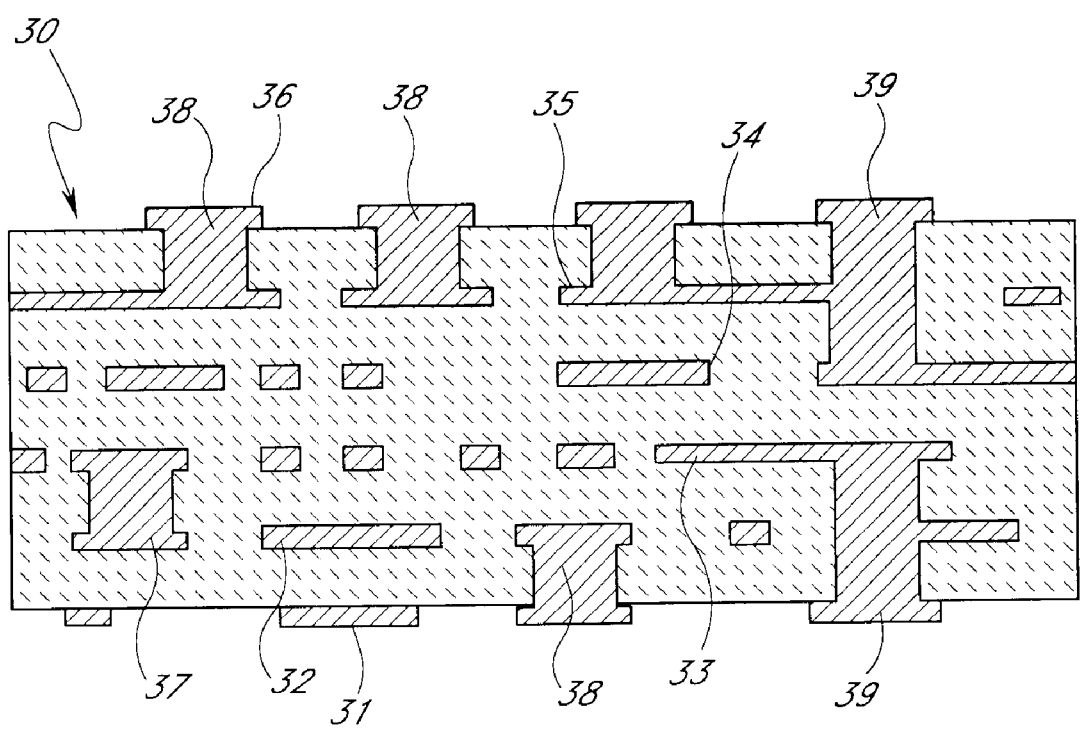
FIG. 3 is a partial cross section showing one example of the multilayer wiring board which can be formed by the present invention.

According to the above step, a wiring layer is further formed on the top layer so that a multilayer wiring board 30 shown in FIG. 3. for example, can be manufactured. The multilayer wiring board 30 is a six-layer board having a six-layer circuit configuration in that wiring layers 31 through 36 are laminated. Inside the board, inter-layer connecting structures 37, 38 and 39 corresponding to a via hole are formed by the pillar-like metallic body 24a. The inter-layer connecting structure 37 connects the first layer and the second layer in the case where the wiring layer is formed on both surfaces of the substrate. The inter-layer connecting structure 38 connects the second layer and the third layer. The inter-layer connecting structure 39 connects the first layer and the third layer. In the present invention, in the case where the first layer is connected with the third layer, the pillar-like metallic body 24a which connects the second layer and the third layer may be further formed above the pillar-like metallic body 24a which connects the first layer and the third layer.

The multilayer wiring board of the present invention is manufactured by the above-mentioned manufacturing steps and has materials and structure according to the manufacturing steps. Moreover, in the case where another well-known step which is adopted by this kind of manufacturing method is added, the board has materials and structure according to this added step.

Namely, as shown in FIG. 11, the multilayer wiring board of the present invention has a structure in which the lower wiring layer and the upper wiring layer are electrically connected and which comprises the lower wiring layer 22, the protective metallic layer 11 provided on a part of the upper surface of the wiring layer 22, the pillar-like metallic body 24a provided on the whole upper surface of the protective metallic layer 11 and the upper wiring layer 27, a part thereof being electrically connected with the pillar-like metallic body 24a.

The multilayer wiring board of the present invention can be manufactured by a method other than the manufacturing method of the present invention, and for example, the following method can be used. Namely, a laminated body, in which a first layer which is. a metallic layer before a lower wiring layer is patterned, a second metallic layer constituting a protective metallic layer and a third metallic layer constituting a pillar-like metallic body are laminated, is formed by rolling, plating or the like. A mask layer is provided on the surface of the third layer of the laminated body and is etched so that a pillar-like metallic body is formed. If necessary, only the second layer is selectively removed, an insulating material (thermoset resin or the like) is applied to the second layer on which the pillar-like metallic body is formed. The upper wiring layer which is patterned is thermally pressed so that the pillar-like metallic body and the upper wiring layer are electrically connected. Thereafter, the first layer is etched or the like so that the lower wiring layer is patterned, and the second layer is removed if it is not removed.

Another Mode of First Embodiment

There will be explained below another mode of the present invention.

1) The above embodiment explains the example that the pillar-like metallic body is formed on both the surfaces of the substrate, but the pillar-like metallic body may be formed only on one surface of the substrate, namely, the wiring layer may be laminated only on one surface. In this case, since the surface of the substrate where the wiring layer is not laminated can be supported firmly, the grinding and abrading step can be executed easily and securely. As a result, the reliability of the obtained multilayer wiring board is heightened.

2) The above embodiment explains the example that after the base conductive layer is formed by electroless plating on the whole surface of the previously patterned lower wiring layer including the non-patterned portion, the whole surface is further plated electrolytically. However, the lower wiring layer is patterned after the whole surface of the insulating layer is subject to electroless plating so that the base conductive layer is formed, and its whole surface is electrolytically plated so that the protective metallic layer may be formed. In this case, since the base conductive layer already exists, the lower wiring layer can be patterned by pattern plating utilizing electrolytic plating. In the above methods, the base conductive layer is formed by electroless plating, but it can be formed by sputtering or the like.

3) The above embodiment explains the example that the mask layer is formed by printing, but the mask layer may be formed by using dry film resist or the like. In this case, thermocompression bonding, exposure and image development of the dry film resist are carried out. Moreover, in order to remove (peel) the mask layer, methylene chloride, sodium hydroxide or the like is used.

In addition, the mask layer may be formed by metal showing resistance at the time of etching the plating layer. In this case, the metal which is the same as the protective metallic layer can be used, and the mask layer may be formed in a predetermined position by the similar method to the pattern formation. In the case where the mask layer is formed by conductor such as metal, the upper wiring layer which is conductive with the pillar-like metallic body can be formed without removing the mask layer. For example, in a state that the metallic mask layer remains, when a copper-foiled insulating material (thermoset resin) is thermally pressed and the insulating layer is formed, the metallic mask layer is electrically connected with the copper foil and the copper foil is patterned so that the upper wiring layer can be formed.

4) The above embodiment explains the example that the insulating material is ground and abraded so that the insulating layer having the same thickness as the height of the pillar-like metallic body is formed. However, the resin as the insulating material is heated and pressurized so that the insulating layer having approximately the same thickness as the height of the pillar-like metallic body may be formed. In this case, the insulating resin which slightly remains on the pillar-like metallic body can be easily removed by a plasma process or the like, or it is abraded after heating so as to be flattened.

5) The above embodiment explains the example that the mask resin is removed between the step (1d) and the step (1e), but the order of the step of removing the mask layer is not limited to this. For example, the mask layer may be removed just after the step of etching the protective metallic layer, just after the step of soft-etching the base conductive layer or when the insulating material 26a is ground and abraded.

6) The above embodiment explains the example that the lower wiring layer having the base conductive layer is coated with the protective metallic layer, but the lower wiring layer may be directly coated with the protective metallic layer without forming the base conductive layer. In this case, the lower wiring layer may be coated with the protective metallic layer by electroless plating or the like. Moreover, the protective metallic layer covering the non-patterned portion is removed only by etching which can corrode the protective metallic layer so that short circuit between the patterned portions can be prevented.

Figure 2A:
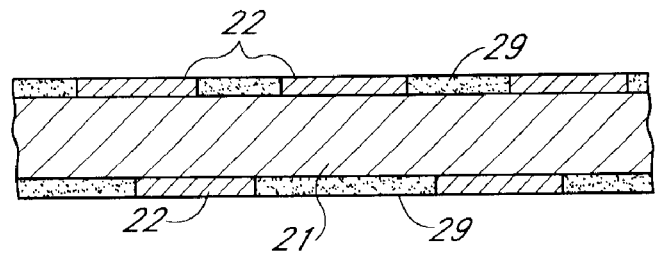
FIGS. 2a, 2b and 2c are step diagrams showing another mode of the first embodiment.
Figure 2B:
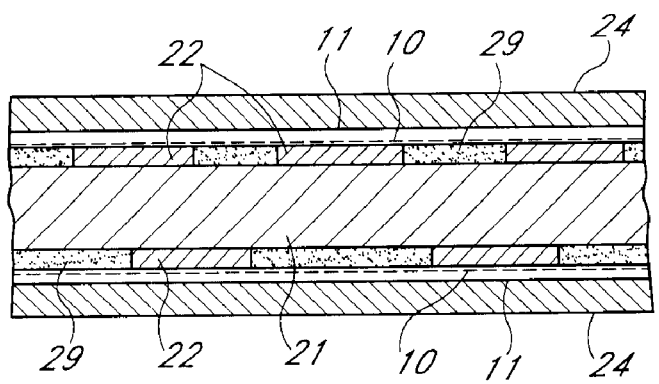
Figure 2C:
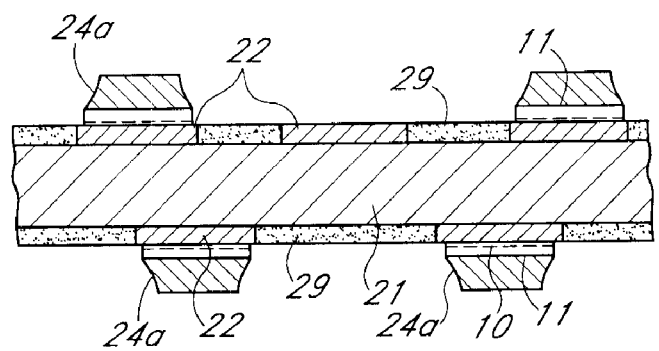

7) The above embodiment explains the example that the step (1a) shown in FIG. 1a is executed. However, as shown in FIG. 2a, prior to the step (1a), a insulating layer 29 having the approximately same thickness as the patterned portion of the wiring layer 22 may be formed on the non-patterned portion of the lower wiring layer 22, so that the surface is flattened in this case, the insulating layer 29 may be formed by the same material, applying method, hardening method and grinding and abrading method as the insulating layer 26. Thereafter, similarly to the above-mentioned embodiment, the plating layer 24 is formed (see FIG. 2b), and the base conductive layer 10 is removed (see FIG. 2c).

Second Embodiment

The present embodiment explains an example that a wiring layer and a pillar-like metallic body are formed on both the surfaces of the substrate as an insulating layer.

Figure 4A:
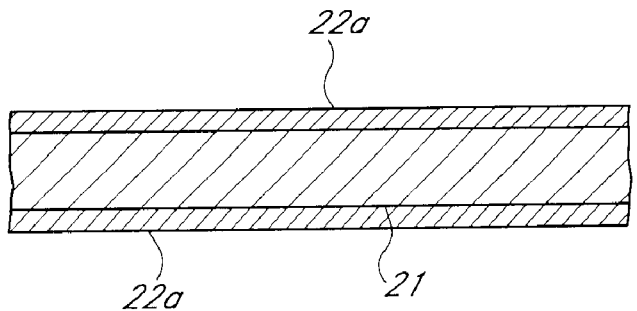
FIGS. 4a through 4d are step diagrams showing a method of manufacturing a multilayer wiring board according to a second embodiment of the present invention.

At first, as shown in FIG. 4a, a substrate 21 as an insulating layer where a metallic panel layer 22a is formed on its approximately whole surface is prepared. As the substrate 21, a substrate which is made of, for example glass fiber and various reactive curing resin such as epoxy resin and polyimide resin can be used. Moreover, as the metal constituting the metallic panel layer 22a, normally copper, nickel, tin or the like is used, and preferably copper is used. The metallic panel layer 22a can be formed by laminating by means of plating, adhesive, thermocompression bonding or the like. In the case where plating is carried out, electroless plating, or a combination of electroless plating and electrolytic plating can be adopted.

Figure 4B:
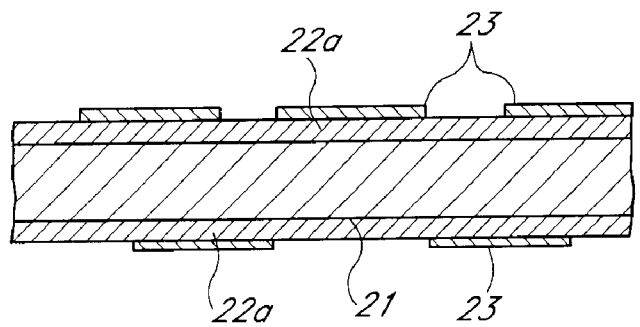

As shown in FIG. 4b, at step (2a), a conductive layer 23, which has resistance at the time of etching the metallic panel layer 22a and has the same pattern as the wiring layer 22 to be formed, is formed on the surface of the metallic panel layer 22a provided on the whole surface of the substrate 21.

The step (2a) can be executed by a method of plating after plating resist having a desired pattern is formed by using a dry film, photosensitive resin paint screen printing or the like, a method of etching after etching resist having a desired pattern is formed on the metallic layer formed on the whole surface by using a dry film, photosensitive resin paint, screen priming or the like, a printing method by means of screen printing using conductive paint, or a method of sputter in a state that a mask is formed into a desired pattern or the like.

However, the following method is preferable. After the metallic panel layer 22a is coated with a photosensitive resin layer, a portion where the conductive layer 23 is formed is pattern-exposed and developed so as to be removed. The removed portion is plated with metal so that the conductive layer 23 is formed. The present embodiment will detail this method.

The photosensitive resin layer is a resin composition containing monomeric and/or polymeric component which causes photo-decomposition, photo-crosslinkage, or photo-polymerization due to a light. As for the coating, a method of laminating a dry film, a method of applying and curing a photosensitive resin composite or the like can be used. The dry film (photo-resist) includes organic solvent developing type or alkaline solution developing type films, and the dry film is thermocompression-bonded (laminated) by using a dry film laminator or the like having a heat bonding roll or the like. Application of the photosensitive resin composition can be carried out by using various coaters.

Next, the portion where the conductive layer 23 is formed is pattern-exposed, developed and removed so that a removed pattern is formed. The pattern exposure is carried out in a state that a photo-mask-use film intervenes or according to direct exposure by means of a photo plotter or the like by using an exposing machine, an ultraviolet ray and the like. For the image development, a developing solution or the like according to types of the dry film is used. For example, trichloroethane, methylene chloride or the like is used for an organic solvent developing type dry film, and sodium carbonate, sodium hydroxide or the like is used as an alkaline solution developing type dry film.

Further, the removed portion is plated with metal so that the conductive layer 23 is formed. As this plating, electroless plating can be used but it is preferable that electrolytic plating is carried out in a state that this portion is conductive with the metallic panel layer 22a to be a base. As a result, adhesion to the wiring layer 22 to be formed can be heightened. As the plating metal, in the case where the metal constituting the metallic panel layer 22a and the plating layer 24 is copper, gold, silver, zinc, palladium, ruthenium, nickel, rhodium, lead-tin soldering alloy, nickel-gold alloy or the like is suitably used. As the electrolytic plating method, there is a method of soaking a substrate to be plated into a plating solution with which the above metal is dissolved and suitably making them conductive via the metallic panel layer 22a and processing them for predetermined time at predetermined temperature. At this time, as the plating solution, solutions on the market which cope with the above metal can be used.

In the above manner, the conductive layer 23 for patterning the wiring layer 22 can be formed. Moreover, a thickness of the conductive layer 23 may be such that the patterned portion can be protected (resist) at the time of etching, namely, it is preferably 10 to 100 μm.

Figure 4C:
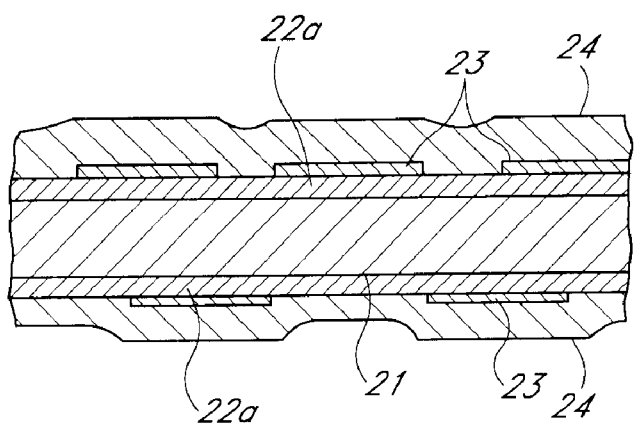

At the step (2b), as shown in FIG. 4c, the metallic plating layer 24 which can be etched simultaneously with the metallic panel layer 22a is formed on an approximately whole surface of the metallic panel layer 22a including the conductive layer 23. As the metal, normally copper, nickel or the like is used, and the same metal as the metallic panel layer 22a is preferable, and copper is particularly preferable. The formation of the plating layer 24 is carried out by electroless plating or electrolytic plating, but electrolytic plating is preferable due to the above reason. A concrete thickness of the plating layer 24 is, for example, 20 to 200 μm or more. At step (2b), since the plating layer 24 is formed on the whole surface in such a manner, the height of the plating layer 24 becomes approximately uniform so that the pillar-like metallic body 24a having approximately uniform height can be formed.

Figure 4D:
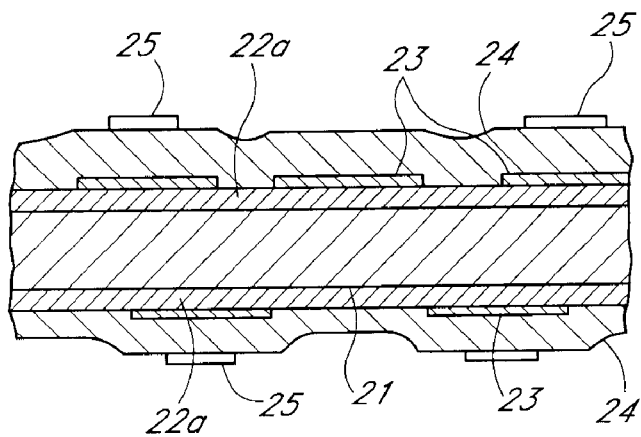

At the step (2c), as shown in FIG. 4d, the mask layer 25 is formed on a surface portion of the plating layer 24 where the pillar-like metallic body 24a is formed. The present embodiment explains the example that the mask layer 25 is printed into a scatter point state by screen printing. The individual sizes (area or outer diameter) of the mask layers 25 are determined according to the size of the pillar-like metallic body 24a, and the mask layer 25 having an outer diameter of not less than 20 μm is exemplified. At step (2c), since the mask layer 25 is formed into the scatter point state in such a manner, the mask layer 25 can be formed by the easy and low-priced method such as printing.

Figure 4E:
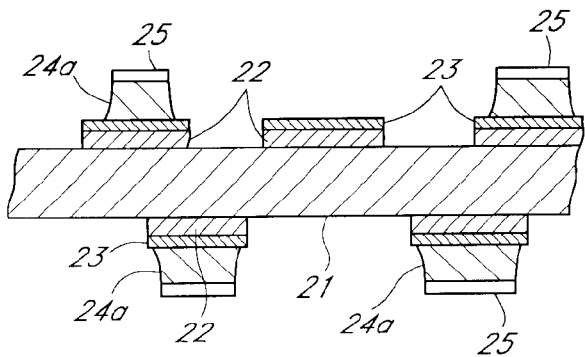
Figure 4F:
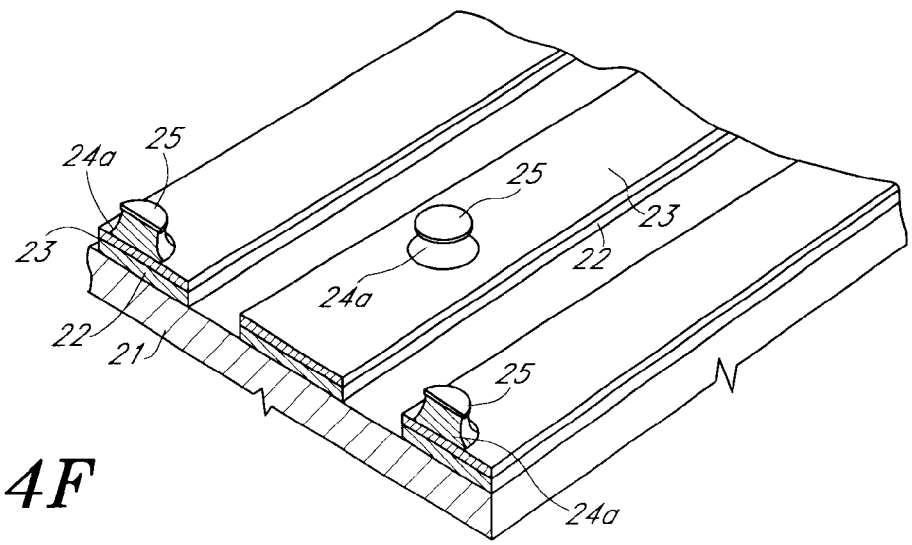

At the step (2d), as shown in FIGS. 4e and 4f, the metallic panel layer 22a and the plating layer 24 are etched. Here, FIG. 4f is a perspective view, partly in cross section of FIG. 4e. As the etching method, there is an etching method using various etching solutions according to types of the metal constituting the metallic panel layer 22a, the plating layer 24 and the conductive layer 23. For example, in the case where the plating layer 24 (namely, the pillar-like metallic body 24a) is copper and the conductive layer 23 is gold, silver, zinc, palladium, ruthenium, nickel, rhodium, lead-tin soldering alloy, nickel-gold alloy or the like, an alkaline etching solution on the market is used. According to the etching, as shown in FIGS. 4e and 4f, the wiring layer 22 on which the conductive layer 23 is formed, the pillar-like metallic body 24a and the mask layer 25 on the surface of the wiring layer 22 are not etched so as to remain.

Figure 4G:
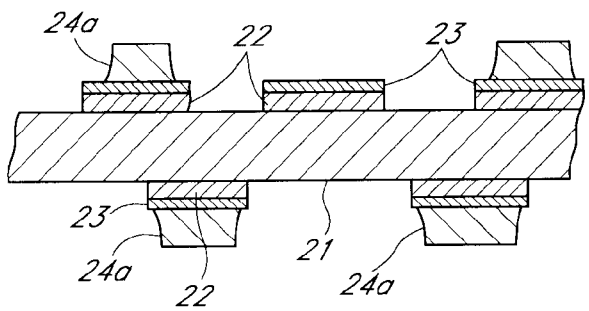

Next, as shown in FIG. 4g, the mask layer 25 is removed, but selection is suitably made from removal with agent, removal with peeling and the like according to type of the mask layer 25. For example, in the case where the mask layer 25 is formed by photosensitive ink according to screen printing, it is removed by alkaline agent or the like.

Figure 4H:
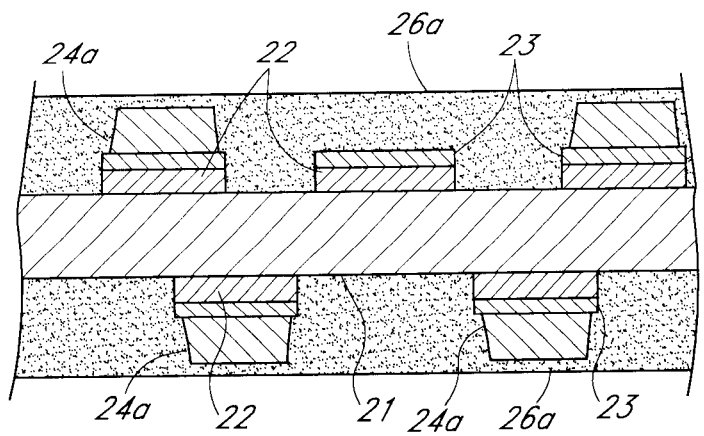
FIGS. 4h through 4j are step diagrams showing the second embodiment.

As shown in FIG. 4h, the insulating material 26a for forming the insulating layer 26 is applied. As the insulating material 26a, for example, reactive curing resin such as low-priced liquid polyimide resin having good insulation can be used. After this resin is applied so as to be slightly thicker than the height of the pillar-like metallic body 24a by various methods, it may be cured by heating, light emission or the like. In the coating method, hot press and various coaters are used.

Figure 4I:
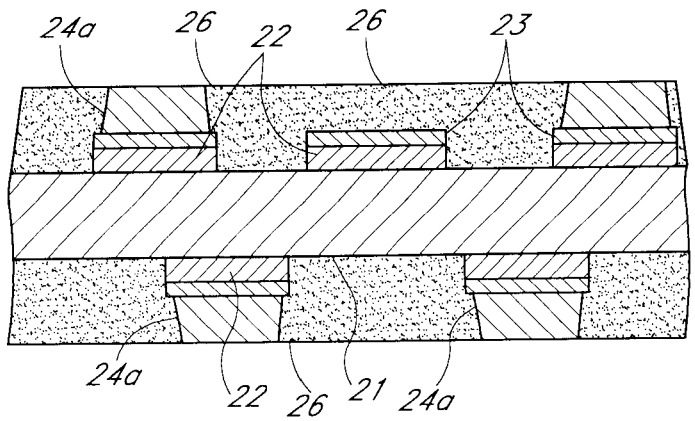

As shown in FIG. 4i, the cured insulating material 26a is ground and abraded so that the insulating layer 26 having approximately same thickness as the height of the pillar-like metallic body 24a is formed. As the grinding method, there is a method using a grinding machine having a plurality of hard rotary blades made of diamond in a radial direction of a rotary board. In this method, while, the above hard rotary blades are being rotated, they are moved along the upper surface of the fixed wiring board so that the upper surface can be flattened. Moreover, as the abrading method, there is a method of slightly grinding by means of a belt sander, buffing or the like.

Figure 4J:
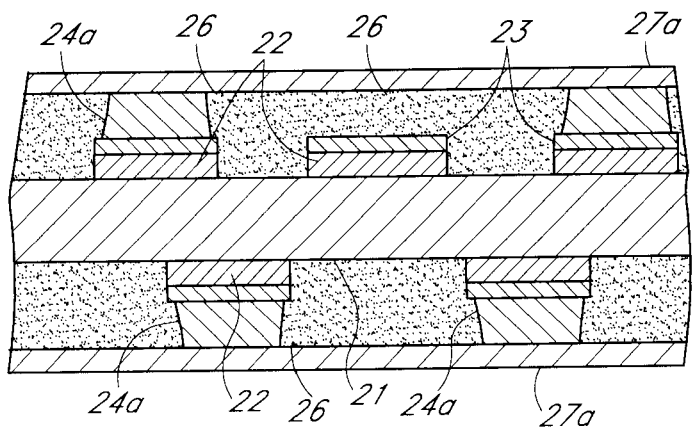

As shown in FIG. 4j, a metallic panel layer 27a for forming the upper wiring layer is formed on the approximately whole surface of the insulating layer 26. Thereafter, the above steps are repeated so that a laminated structure, in which the lower wiring layer and the upper wiring layer are electrically connected via the pillar-like metallic body, is further formed on the top layer. In the case where the topmost wiring layer is formed, it is not particularly necessary to form the pillar-like metallic body above it. For this reason, the wiring layer may be patterned by the similar method to the conventional one. For example, the wiring layer having a predetermined pattern can be formed by a method using etching resist, a method using a pattern plating-use resist or the like.

According to the above steps, similarly to the first embodiment, the multilayer wiring board 30 shown in FIG. 3, for example, can be manufactured. The multilayer wiring board of the present invention is manufactured by the above manufacturing steps, and has the materials and structure according to the manufacturing steps. Moreover, in the case where another well-known step is added to the manufacturing steps, the multilayer wiring board has materials and structure according to the added step.

Namely, as shown in FIG. 4j, the multilayer wiring board of the present invention has the structure that the lower wiring layer and the upper wiring layer are electrically connected by the lower wiring layer 22, the conductive layer 23 having the same pattern provided on the upper surface the wiring layer 22, the pillar-like metallic body 24a provided on the upper surface of the conductive layer 23 and the upper wiring layer, a part thereof being electrically connected with the pillar-like metallic body 24a.

Another Mode of Second Embodiment

There will be explained below another mode of the present invention.

1) The above embodiment describes the example that the pillar-like metallic body is formed on both the surfaces of the substrate. However, the pillar-like metallic body may be formed only on one surface of the substrate, namely, on one surface of the laminated layer of the wiring layers. In this case, since the surface of the substrate where the wiring layers are not laminated can be supported firmly, the grinding and abrading step can be executed securely. As a result, the reliability of the obtained multilayer wiring board can be heightened.

2) The above embodiment describes the example that the mask layer is printed, but the mask layer may be formed by drum film resist or the like. In this case, the thermocompression boding, exposure and image development of the dry film resist can be carried out. Moreover, when the mask layer is removed (peeled), methylene chloride, sodium hydroxide or the like is used.

3) The embodiment describes the example that the insulating layer having the same thickness as the height of the pillar-like metallic body is formed by grinding and abrading the insulating material. However, resin as the insulating layer is heated and pressurized so that the insulating layer having the same thickness as the height of the pillar-like metallic body may be formed. In this case, the insulating resin which thinly remains on the pillar-like metallic body can be removed easily by a plasma process or the like or is ground after heating so as to be flattened.

4) The above embodiment explains the example that after the wiring layer having a conductive layer on its surface, and the pillar-like metallic body are formed by etching at step (2d), the conductive layer is not peeled and the steps thereafter are executed. However, aft the conductive layer which remains on the wiring layer is peeled, the steps thereafter may be executed. In this case, the peeling method includes a soft etching method using etching solution which difficulty corrode the wiring layer and the pillar-like metallic body such as acid etching solution for solder removing, and a physical method such as sputter etching.

When such peeling is carried out, a copper surface of the base wiring layer can be exposed, and the exposed copper surface is subject to the surface process so that the adhesive with the insulating layer made of resin formed on the copper surface can be heightened. The surface process at this time includes a black oxidation process of oxidizing the copper with oxidizing agent, a physical roughing process or the like.

Third Embodiment

The present embodiment describes the example that when the wiring layer is laminated an both the surfaces of the substrate, the pillar-like metallic body is formed on both the surfaces of the substrate.

Figure 5A:
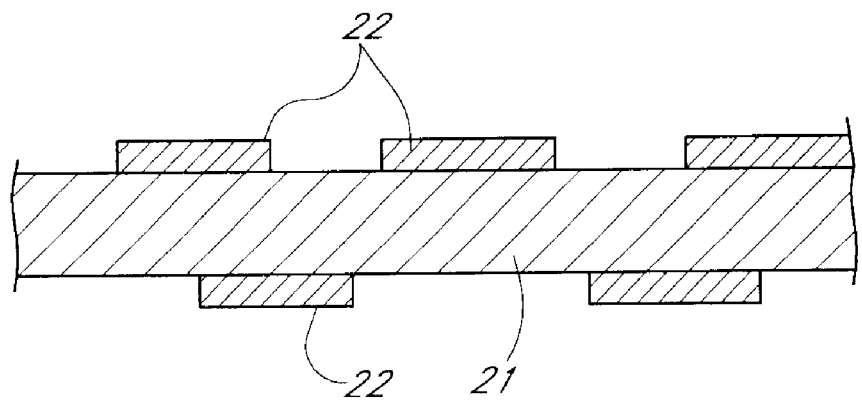
FIGS. 5a through 5c are step diagrams showing a method of manufacturing multilayer wiring bond according to a third embodiment of the present invention.

At first, as shown in FIG. 5a, the substrate 21 where the wiring layer 22 is patterned on its both surfaces is prepared. At this time, any patterning method may be used, and for example, a method using etching resist, a method using pattern plating resist or the like may be used. As the substrate 21, a substrate composed of glass fiber and various reactive curing resin such as polyimide resin and the like can be used, and as the metal constituting the wiring layer 22, normally copper, nickel tin or the like is used.

At step (3a), as shown in FIGS. 5b through 11 (4), a protective layer, in which a portion where the pillar-like metallic body 24a is formed is formed by the conductor 23, and the other portion is formed by a insulator 20b, is formed so as to cover the approximately whole surface of the wiring layer 22. The present embodiment will describe the example that after the wiring layer 22 is coated with a photosensitive resin layer 20, a portion where the conductor 23 is formed is pattern-exposed and developed so as to be opened, and a generated opening section 20a is plated with metal so that the protective layer is formed.

Figure 5B:
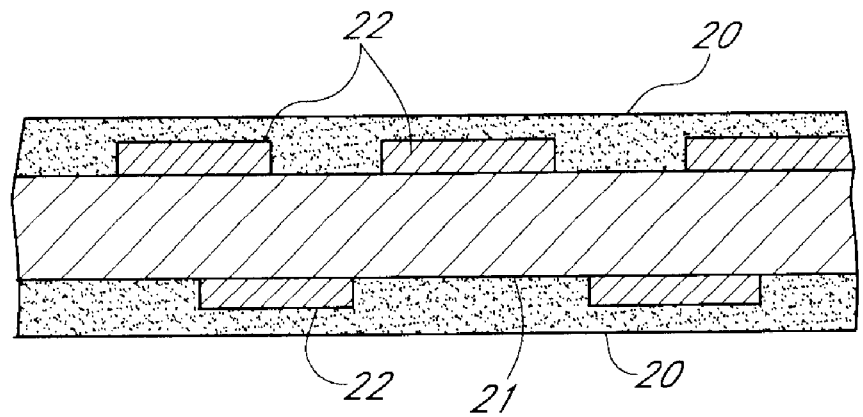

At first, as shown in FIG. 5b, the wiring layer 20 is coated with the photosensitive resin 20. Here, the photosensitive resin layer 20 is a resin composition containing monomeric and/or polymeric component which causes photo-decomposition, photo-crosslinkage, or photo-polymerization due to a light. As the coating method, a method of laminating a dry film, a method of applying/curing the photosensitive resin composite or the like can be used. The dry film (photo resist) includes an organic solvent developing type dry film and an alkaline solvent developing type dry film, and thermocompression-bonding (lamination) is cared out by using a dry film laminator having a thermocompression bonding roll or the like. The photosensitive resin composite is applied by using various coaters.

Figure 5C:
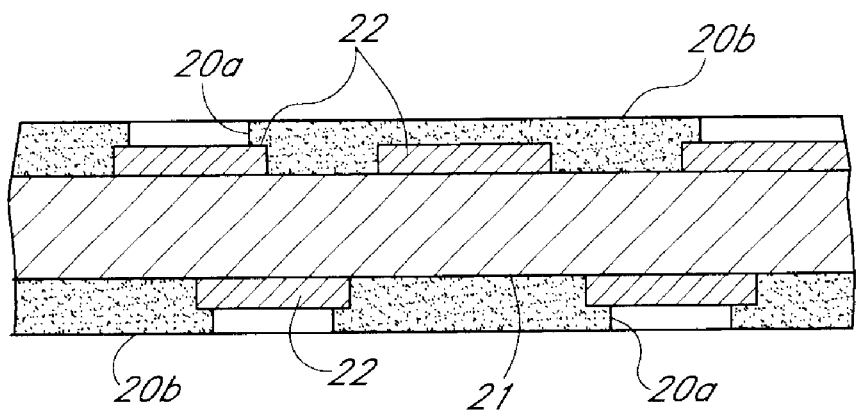

Next, as shown in FIG. 5c, the portion where the conductor 23 is formed is pattern-exposed and developed and opened so that the opening section 20a is formed, and the insulator 20b constituting one portion of the protective layer is allowed to remain. The pattern exposure is carried out in a state that a photo-mask-use film intervenes or according to direct exposure using photo-plotter by an exposing device normally using ultraviolet rays or the like. A developing solution or the like according to types of the dry film is used for the development, and for example, trichloroethane, methylene chloride or the like is used for an organic solvent developing type dry film, and sodium carbonate, sodium hydroxide or the like is used as an alkaline solution developing type dry film.

Figure 5D:
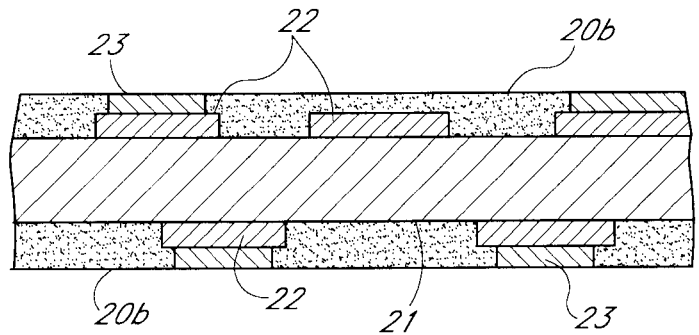
FIGS. 5d through 5f are step diagrams showing the third embodiment.

Further, as shown in FIG. 5d, the opening section 20a is plated with metal so that the conductor 23 constituting one portion of the protective layer is formed. At the time of plating, it is preferable that electroless plating in which metal constituting the lower wiring layer 22 (pattern formed section) is used as catalyst is carried out. Moreover, it is preferable that when the metal constituting the pillar-like metallic body 24a is etched, it is preferable that plating with metal showing resistance is executed. More concretely, the metal constituting the pillar-like metallic body 24a is copper and the metal constituting the conductor 23 is nickel-gold alloy, tin-lead soldering alloy or the like. These alloys can be subject to the above selective plating in which copper is used as catalyst, and shows high resistance at the time of etching copper, and thus they are particularly preferable as the metal constituting the conductor of the present invention.

The electroless plating method includes a method of soaking the substrate to be plated in a plating liquid with which the above metal or the like is dissolved and processing for predetermined time at predetermined temperature. At this time, the plating liquid composite includes metallic ion source, alkaline source, reducing agent, chelator and the like, but they on the market can be used.

In such a manner, the protective layer, in which the portion where the pillar-like metallic body 24a is formed is formed by the conductor 23 and the other portion is formed by the insulator 20b, is formed. As for a size and a shape of the portion of the conductor 23, namely, the opening section 20a, the size is smaller than a width of the pattern of the lower wiring layer 22 and is preferably such that the conductivity with the pillar-like metallic body 24a can be sufficiently secured, and the shape is any shape including a circular shape. Moreover, the conductor 23 section may have a thickness which can protect the lower wiring layer 22 at the time of etching, and it may be preferably 5 $\mu$m or more.

Figure 5E:
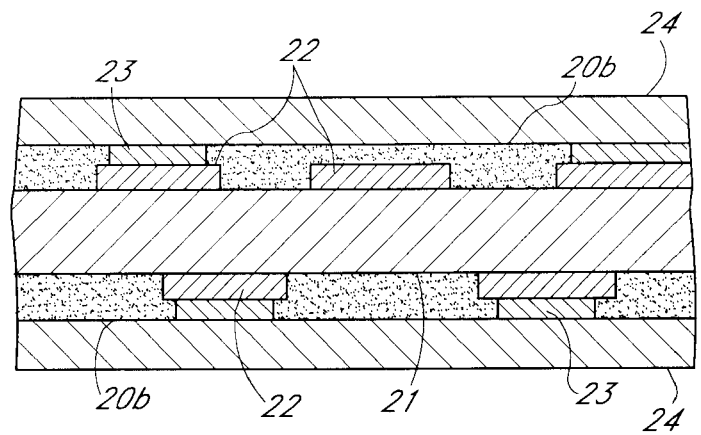

At above step (3b), as shown in FIG. 5e, the metallic plating layer 24 constituting the pillar-like metallic body 24a is formed on the approximately whole surface of the protective layer, As the metal, normally copper, nickel or the like is used, and as the plating method, electroless plating, or combination of electroless plating and electrolytic plating is adopted. A concrete thickness of the plating layer 24 is for example, 20 to 200 $\mu$m or more. Since the plating layer 24 is formed on the whole surface at step (3b), the height of the plating player 24 becomes approximately uniform, and thus the pillar-like metallic body 24a having approximately uniform height can be formed.

Figure 5F:
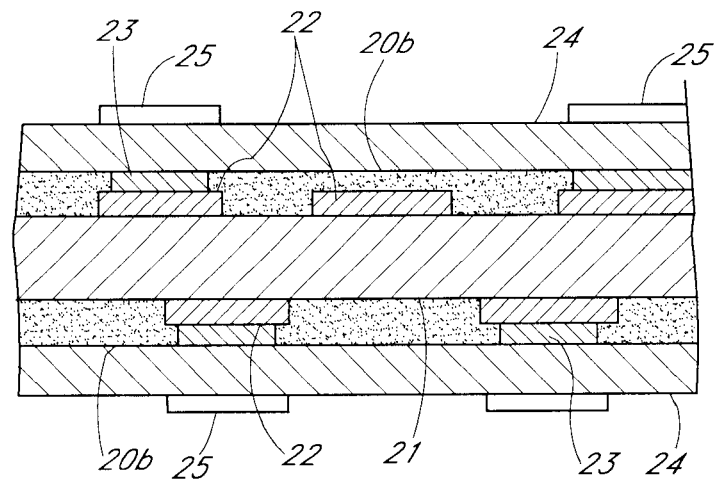

At step (3c), as shown in FIG. 5f the mask layer 25 is formed on a surface portion of the plating layer 24 where the pillar-like metallic body 24a is formed. The present embodiment will explains the example that the mask layer 25 is printed into a scatter point state by screen printing. The respective sizes (area or outer diameter) of the mask layer 25 are determined according to the size of the pillar-like metallic body 24a, and the mask layer 25 having an outer diameter of, for example, 100 to 300 μm or more is exemplified. Since the mask layer 25 is formed into the scatter point state at step (3c) in such a manner, the mask layer 25 can be formed by the simple and low-priced method such as printing.

Figure 5G:
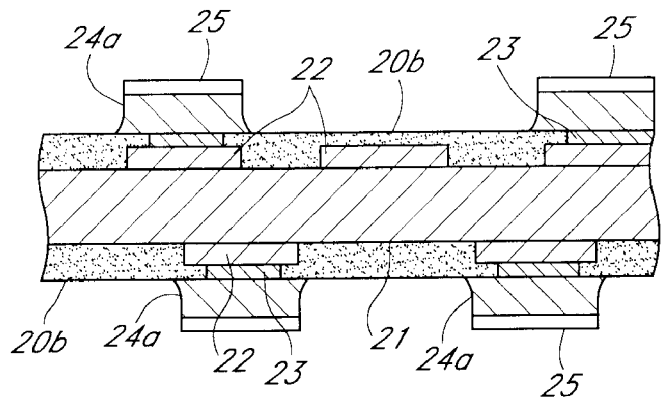
FIGS. 5g through 5i are step diagrams showing the third embodiment.

At step (3d), as shown in FIG. 5g, the plating layer 24 is etched. As the etching method, there is an etching method using various etching solutions according to types of the metal constituting the plating layer 24 and the conductor 23. For example, in the case where the plating layer 24 (namely, the pillar-like metallic body 24a) is copper and the conductor 23 is nickel-gold alloy or tin-lead soldering alloy, the alkaline etching solution on the market is used According to the above etching, as shown in FIG. 5g, the wiring layer 22 covered with the protective layer, the pillar-like metallic body 24a and the mask layer 25 are not etched so as to remain.

Figure 5H:
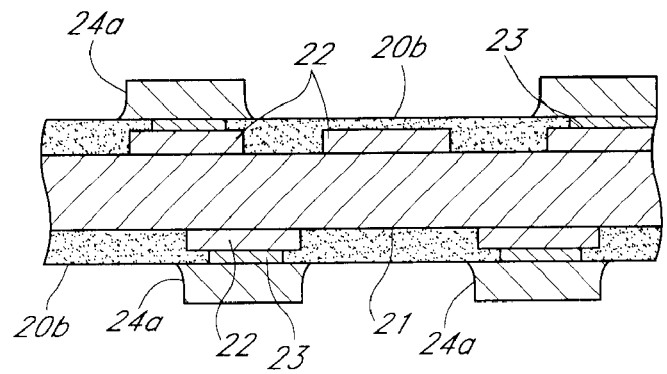

As shown in FIG. 5h, the mask layer 25 is removed, the removing method may be selected suitably from agent removal, peeling removal and the like according to types of the mask layer 25. For example, in the case where the mask layer 25 is formed by screen printing by using photosensitive ink, the mask layer 25 is removed by an alkaline agent or the like.

Figure 5I:
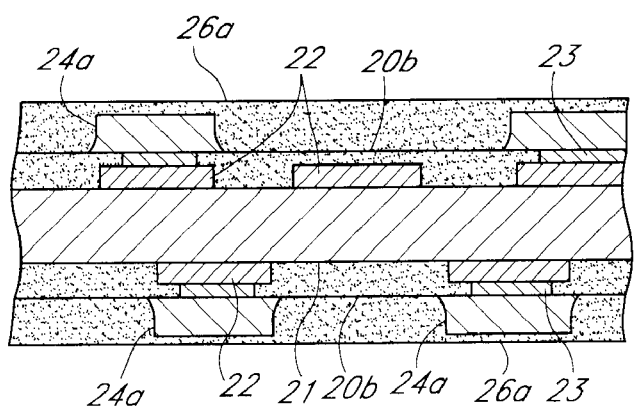

As shown in FIG. 5i, the insulating material 26a for forming the insulating layer 26 is applied. The reactive curing resin such as low-priced liquid polyimide resin having good insulation can be used as the insulating material 26a After the insulating material 26a is applied so as to be thicker than the height of the pillar-like metallic body 24a by various methods, it may be cured by heating, light emission or the like. As the coating method, a hot press and various coaters are used.

Figure 5J:
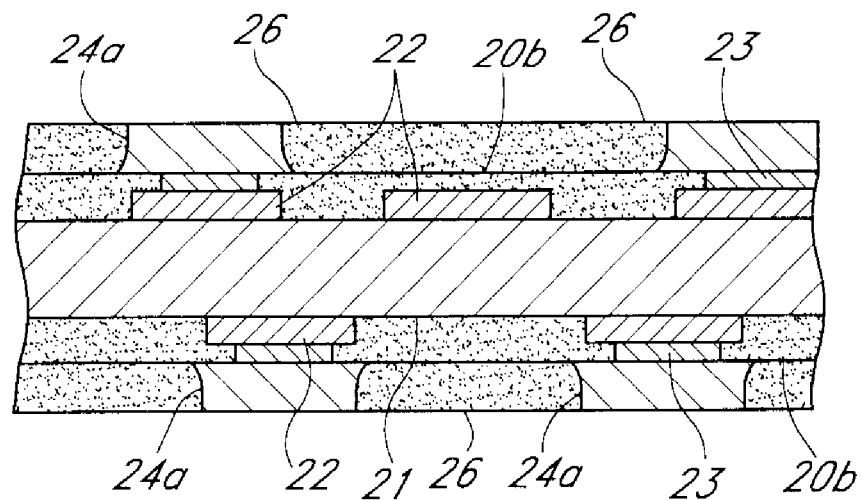
FIGS. 5j and 5k are step diagrams showing the third embodiment.

As shown in FIG. 5j, the cured insulating material 26a is ground and abraded so that the insulating layer 26 having the approximately same thickness as the height of the pillar-like metallic body 24a is formed. As the grinding method, there is a method using a grinding machine having a plurality of hard rotary blades made of diamond in a radial direction of a rotary board. While the above hard rotary blades are being rotated, they are moved along the upper surface of the fixed wiring board so that the upper surface can be flattened. Moreover, as the abrading method, there is a method of slightly grinding by a belt sander, buffing or the like.

Figure 5K:
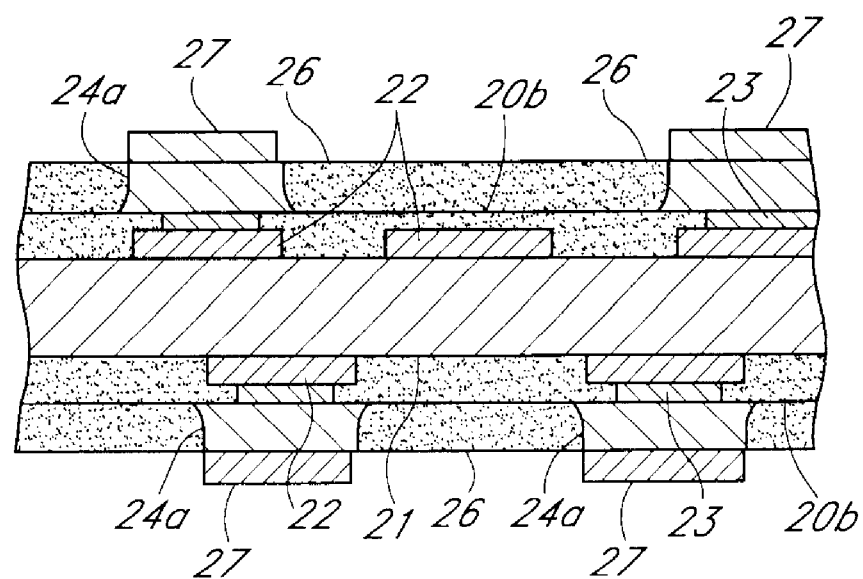

As shown in FIG. 5k, the upper wiring layer 27, a part thereof being electrically connected with the pillar-like metallic body 24a, is formed. The wiring layer 27 can be formed by the similar method to the method of forming the lower wiring layer 22. For example, a predetermined mask is formed by using photolithography technique and is subject to the etching process so that the wiring layer 27 having a predetermined pattern can be formed.

According to the above steps, the wiring layer is further formed on the top layer so that the multilayer board 30 shown in FIG. 3, for example, can be manufacturing similarly to the first embodiment. The multilayer wiring board of the present invention is manufactured by the above manufacturing steps, and has the materials and structure according to the manufacturing steps. Moreover, in the case where another well-known step which is adopted to the manufacturing method is added, the multilayer wiring board has materials and structure according to the added step.

Namely, as shown in FIG. 5k, the multilayer wiring board of the present invention has the structure that the lower wiring layer and the upper wiring layer are electrically connected by the lower wiring layer 22, the conductor 23 provided on the upper surface of the wiring layer 22, the pillar-like metallic body 24a having a larger diameter provided on the upper surface of the conductor 23, and the upper wiring layer, a part thereof being electrically connected with the pillar-like metallic body 24a.

Another Mode of Third Embodiment

There will be explained another embodiment of the present invention.

1) The above embodiment explains the example that the pillar-like metallic body is formed on both the surfaces of the substrate, but the pillar-like metallic body may be formed only on one surface of the substrate, namely, on one surface of the laminated layer of the wiring layers. In this case, since the non-laminated surface of the substrate can be supported firmly, the grinding and abrading step can be executed easily and securely. As a result, the reliability of the obtained multilayer wiring board is heightened.

2) The above embodiment describes the example that the conductor constituting one portion of the protective layer is formed by plating, but electrically conductive paste is printed, applied and cured so that a conductor portion can be formed. In this case, the screen printing or the like can be used.

In addition, solder coating or the like using solder can be also used. For example, in the case where tin-lead soldering alloy is used, an alkaline etching solution is used as an etching solution for the plating layer (copper) so that the solder can show resistance.

Further, the conductor portion can be formed also by sputtering using chrome or rhodium. In this case, the portion other than the opening section is coated with a mask material so that the conductor may be formed only on the opening section.

3) The above embodiment describes the example that the mask layer is formed by printing, but it may be formed by using dry film resist or the like. In this case, the thermocompression bonding, exposure and image development of the dry film resist are carried out. Moreover, for the removal (peeling) of the mask layer, methylene chloride, sodium hydroxide or the like is used.

4) The above embodiment describes the example that the insulating material is ground and abraded so that the insulating layer having the approximately same thickness as the height of the pillar-like metallic body is formed. However, resin as the insulating material is heated and pressurized so that the insulating layer having the approximately same thickness as the height of the pillar-like metallic body may be formed. In this case, the insulating resin which thinly remains on the pillar-like metallic body can be easily removed by the plasma process or the like, or is abraded after heating so as to be flattened.

Another Manufacturing Method and Multilayer Wiring Board of the Present Invention Another manufacturing method of the present invention is a method of manufacturing a multilayer wiring board including the step of forming a pillar-like metallic body on a top wiring layer by the step of forming the pillar-like metallic body according to the embodiments 1 through 3. Moreover, another multilayer wiring board of the present invention is a multilayer wiring board in which a pillar-like metallic body is formed on a top wiring layer by the step of forming the pillar-like metallic body according to the embodiments 1 through 3.

Figure 6A:
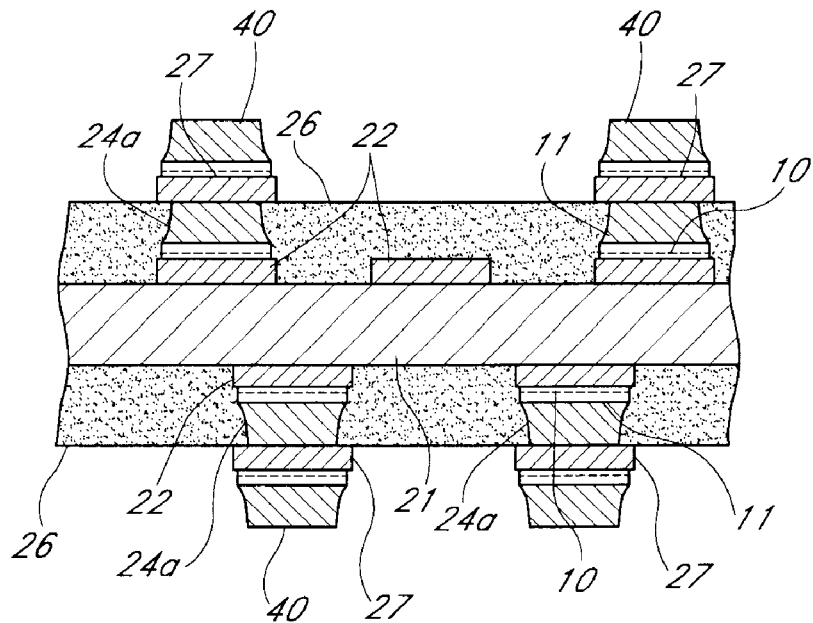
FIGS. 6a and 6b are diagrams showing examples of the multilayer wiring board in which a pillar-like metallic body is formed on a topmost wiring layer.
Figure 6B:
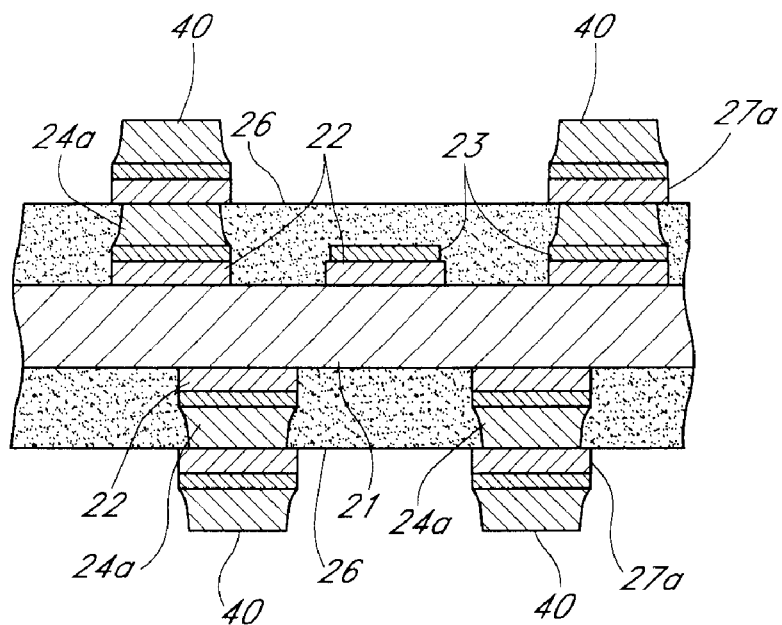

Therefore, another manufacturing method and multilayer wiring board of the present invention can be practiced according to the embodiments 1 through 3, but, for example, in the case where another invention is practiced according to the first embodiment, the multilayer wiring board having the structure shown in FIG. 6a is obtained. In the case where another embodiment is practiced according to the second embodiment, the multilayer wiring board having the structure shown in. FIG. 6b is obtained. The pillar-like metallic body 40 which is used for mounting chip parts is formed on the multilayer wiring board shown in FIGS. 1l and 4j by the method of the respective embodiments.

INDUSTRIAL APPLICABILITY

The present invention is useful particularly as the method of manufacturing the multilayer wiring board having the structure that the lower wiring layer and the upper wiring layer are electrically connected by the pillar-like metallic body. More concretely, the multilayer wiring board, which can be manufactured by a combination of a simple facility and the conventional steps and can thin the wiring layer and heighten the reliability of the wiring board, can be manufactured. Therefore, the industrial applicability of the present invention is high.

What is claimed is:

1. A multilayer wiring board manufacturing method comprising the steps of forming a pillar-like metallic body on a lower wiring layer, and then forming an upper wiring layer, a part thereof being electrically connected with said pillar-like metallic body, wherein the pillar-like metallic body forming step comprises the steps of:

(1a) coating an approximately whole surface of said lower wiring layer previously patterned and a non-patterned portion, with another metal showing resistance at the time of etching the metal constituting said pillar-like metallic body to form a protective metallic layer;

(1b) forming a plating layer of the metal which is to constitute said pillar-like metallic body, on an approximately whole surface of said protective metallic layer by means of electrolytic plating;

(1c) forming a mask layer on a surface portion of said plating layer where said pillar-like metallic body is to be formed;

(1d) etching said plating layer; and (1e) etching under conditions wherein at least said protective metallic layer can be corroded to remove a portion of said protective metallic layer covering the non-patterned portion.

2. The manufacturing method according to claim 1, wherein:

the step (1a) executes electroless plating on the whole surface of said previously patterned lower wiring layer including the non-patterned portion so as to form a base conductive layer and further executes electrolytic plating on the approximately whole surface so as to form said protective metallic layer; and the step (1e) executes the etching under condition wherein said protective metallic layer can be corroded and then removes said baser conductive layer remaining on the non-patterned portion by means of soft etching.

3. The manufacturing method according to claim 1, wherein:

the step (1a) executes electroless plating on an approximately whole surface of an insulating layer so as to form a base conductive layer and then executes electrolytic plating on an approximately whole surface of said patterned lower wiring layer on the base conductive layer so as to form said protective metallic layer; and the step (1e) executes etching under condition wherein said protective metallic layer can be corroded and then removes said base conductive layer remaining on the non-patterned portion by means of soft etching.

4. The manufacturing method according to claim 1, wherein prior to the step (1a), an insulting layer having the approximately same thickness as a patterned portion of said lower wiring layer is formed on the non-patterned portion of said lower wiring layer so that the surface is flattened.

5. The manufacturing method according to claim 1, wherein the metal constituting said pillar-like metallic body is copper and another metal constituting said protective metallic layer is gold, silver, zinc, palladium, ruthenium, nickel, rhodium, lead-tin solder alloy or nickel-gold alloy.

6. A multilayer wiring board, manufactured by the manufacturing method of claim 1, having a structure that a lower wiring layer and an upper wiring layer are electrically connected, the structure comprising said lower wiring layer, a protective metallic layer provided on a past of an upper surface of said wiring layer, a pillar-like metallic body provided on a whole upper surface of said protective metallic layer and said upper wiring layer, a part thereof being electrically connected with said pillar-like metallic body.

7. A multilayer wiring board manufacturing method comprising the steps of forming a pillar-like metallic body on a lower wiring layer, and then forming an upper wiring layer, a part thereof being electrically connected with said pillar-like metallic body, wherein the pillar-like metallic body forming step comprises the steps of:

(2a) forming a conductive layer in a pattern for a lower wiring layer-to-be-formed on a surface of a metallic panel layer provided on an approximately whole surface of an insulating layer, the conductive layer having resistance at the time of etching the metallic panel layer;

(2b) forming a plating layer of metal which can be etched simultaneously as said metallic panel layer on an approximately whole surface of said metallic panel layer with said conductive layer;

(2c) forming a mask layer in a pattern for a pillar-like metallic body-to-be-formed on a surface portion of said plating layer where said pillar-like metallic body is formed; and (2d) etching, as a single etching process, (i) said metallic panel layer to remain in the pattern of the conductive layer and (ii) said plating layer to remain in the pattern of the mask so as to form said lower wiring layer and said pillar-like metallic body.

8. The manufacturing method according to claim 7, wherein the step (2a) coats said metallic panel layer with a photosensitive resin layer and pattern-exposes and develops so as to remove a portion where said conductive layer is formed, and plates the removed portion with metal so as to form said conductive layer.

9. The manufacturing method according to claim 7, wherein the metal constituting said metallic panel layer and said plating layer is copper, and the metal constituting said conductive layer is gold, silver, zinc, palladium, ruthenium, nickel, rhodium, lead-tin solder alloy or nickel-gold alloy.

10. A multilayer wiring board manufactured by the manufacturing method according to one of claims 7 through 9.

11. A multilayer wiring board manufacturing method comprising the steps of forming a pillar-like metallic body on a lower wiring layer, and then forming an upper wiring layer, a part thereof being electrically connected with said pillar-like metallic body, wherein the pillar-like metallic body forming step comprises the steps of:

(3a) forming a protective layer comprised of a portion made of a conductor where said pillar-like metallic body is to be formed and the remaining portion made of an insulator, so that said protective layer covers an approximately whole surface of said lower wiring layer;

(3b) forming a plating layer of metal constituting said pillar-like metallic body on an approximately whole surface of said protective layer;

(3c) forming a mask layer on a surface portion of said plating layer where said pillar-like metallic body is formed; and (3d) etching said plating layer.

12. The manufacturing method according to claim 11, wherein, in step (3a), the conductor is made of a metal and the insulator is made of a photosensitive resin layer, wherein step (3a) comprises: coating said lower wiring layer with a photosensitive resin layer, pattern-exposing and developing the photosensitive resin layer so as to form the insulator with an opened portion where said conductor is to be formed, and plating the opened portion with a metal so as to form said conductor, thereby forming said protective layer comprised of the conductor and the insulator.

13. The manufacturing method according to claim 12, wherein when the opened portion is plated with metal, and electroless plating is carried out by using the metal constituting said lower wiring layer as a catalyst.

14. A multilayer wiring board manufactured by the manufacturing method according to one of claims 11 through 13.

15. A method of manufacturing a multilayer wiring board comprising the step of forming a pillar-like metallic body on a topmost wiring layer of a previously formed multilayer wiring board, by means of the step of forming a pillar-like metallic body according to claims 1, 7 or 11.

16. A multilayer wiring board in which a pillar-like metallic body is formed on a topmost wiring layer of a previously formed multilayer wiring board, by means of the step of forming a pillar-like metallic body according to claim 1, 7 or 11.

\* \* \* \* \*

UNITED STATES PATENT AND TRADEMARK OFFICE
CERTIFICATE OF CORRECTION

PATENT NO.    : 6,555,209 B1
DATED         : April 29, 2003
INVENTOR(S)   : Eiji Yoshimura and Toshiro Higuchi It is certified that error appears in the above-identified patent and that said Letters Patent is hereby corrected as shown below:

<u>Column 20,</u>
Line 1, delete "baser" and insert -- base --;
Line 30, delete "past" and insert -- part --.

Signed and Sealed this

Twenty-third Day of March, 2004

JON W. DUDAS
*Acting Director of the United States Patent and Trademark Office*